(12) United States Patent
Yu et al.

(10) Patent No.: US 8,575,031 B2
(45) Date of Patent: Nov. 5, 2013

(54) METHOD OF FORMING A FINE PATTERN, DISPLAY SUBSTRATE, AND METHOD OF MANUFACTURING THE SAME USING THE METHOD OF FORMING A FINE PATTERN

(75) Inventors: Se-Hwan Yu, Seoul (KR); Chong-Sup Chang, Hwaseong-si (KR); Sang-Ho Park, Suwon-si (KR); Ji-Seon Lee, Suwon-si (KR)

(73) Assignee: Samsung Display Co., Ltd. (KR)

( * ) Notice: Subject to any disclaimer, the term of this patent is extended or adjusted under 35 U.S.C. 154(b) by 72 days.

(21) Appl. No.: 13/349,487

(22) Filed: Jan. 12, 2012

(65) Prior Publication Data

US 2012/0248442 A1  Oct. 4, 2012

(30) Foreign Application Priority Data

Apr. 4, 2011 (KR) .................. 10-2011-0030533

(51) Int. Cl.
*H01L 29/04* (2006.01)
(52) U.S. Cl.
USPC ......... 438/694; 438/22; 257/E21.259; 257/49

(58) Field of Classification Search
USPC ............................ 438/694, 22; 257/E21.259
See application file for complete search history.

(56) References Cited

U.S. PATENT DOCUMENTS 8,071,484 B2 * 12/2011 Kim et al. ................. 438/717

\* cited by examiner

*Primary Examiner* — Zandra Smith
*Assistant Examiner* — Paul Patton
(74) *Attorney, Agent, or Firm* — Innovation Counsel LLP (57) ABSTRACT

A method is provided for forming a fine pattern. In the method, a first fine pattern and a first metal pattern are formed by respectively patterning a first fine pattern layer on a base substrate and a first metal layer on the first fine pattern layer. A second fine pattern layer and a second metal layer are sequentially formed over the first fine pattern and the first metal pattern. The second metal layer is patterned, so that a second metal pattern between adjacent portions of the first fine pattern. The second fine pattern layer is patterned using the second metal pattern as a mask, so that a second fine pattern is formed between adjacent portions of the first fine pattern.

20 Claims, 11 Drawing Sheets

METHOD OF FORMING A FINE PATTERN, DISPLAY SUBSTRATE, AND METHOD OF MANUFACTURING THE SAME USING THE METHOD OF FORMING A FINE PATTERN

PRIORITY STATEMENT

This application claims priority under 35 U.S.C. §119 to Korean Patent Application No. 2011-0030533, filed on Apr. 4, 2011 in the Korean Intellectual Property Office (KIPO), the contents of which are herein incorporated by reference in their entirety.

BACKGROUND OF THE INVENTION

1. Field of the Invention

Example embodiments of the present invention relate generally to flat panel displays. More specifically, example embodiments of the present invention relate to a method of forming a fine pattern, a display substrate and a method of manufacturing the display substrate using the method of forming a fine pattern.

2. Description of the Related Art

Generally, a liquid crystal display device includes a display panel, a polarizer and a backlight assembly.

The display panel includes a first display substrate, a second display substrate and a liquid crystal layer. Wires and patterns are formed on the first display substrate and the second display substrate. Recent high resolution displays employ wires and patterns that have relatively fine widths.

However, in order to form fine wires or patterns using conventional photo lithography, an additional process is required, increasing the number of processes used in fabrication and complicating the overall manufacture. Alternative manufacturing approaches have involved new processes or new materials, requiring investment in new facilities and the new materials, increasing cost.

SUMMARY OF THE INVENTION

Example embodiments of the present invention provide a method of forming a fine pattern using photo lithography.

Example embodiments of the present invention also provide a display substrate including this fine pattern.

Example embodiments of the present invention also provide a method of manufacturing the display substrate using the method of forming the fine pattern.

According to an example embodiment of the present invention, a method is provided for forming a fine pattern. In the method, a first fine pattern and a first metal pattern are formed by respectively patterning a first fine pattern layer on a base substrate and a first metal layer on the first fine pattern layer. A second fine pattern layer and a second metal layer are sequentially formed on the base substrate and over the first fine pattern and the first metal pattern. The second metal layer is patterned, so that a second metal pattern is formed between adjacent portions of the first fine patterns. The second fine pattern layer is patterned using the second metal pattern as a mask, so that a second fine pattern is formed between the adjacent portions of the first fine patterns.

According to another example embodiment of the present invention, a display substrate includes a base substrate, a polarizing layer, a switching element and a pixel electrode. The polarizing layer is on the base substrate and includes a first fine pattern extending in a first direction, a second fine pattern having portions disposed between adjacent portions of the first fine patterns and extending in the first direction, and a polymer pattern filling a space between the first and second fine patterns. The switching element is connected to a data line and a gate line that are formed on the polarizing layer. The pixel electrode is connected to the switching element.

According to still another example embodiment of the present invention, there is provided a method of manufacturing a display substrate. In the method, a polarizing layer is formed on a base substrate. The polarizing layer includes a first fine pattern, a second fine pattern and a polymer pattern. The first fine pattern extends in a first direction. The second fine pattern has portions disposed between adjacent portions of the first fine pattern, and extends in the first direction. The polymer pattern fills a space between the first and second fine patterns. A gate metal layer and a data metal layer, which are formed over the polarizing layer, are patterned, so that a gate line, a data line and a switching element connected to the gate line and the data line are formed. A pixel electrode layer formed over the switching element is patterned, so that a pixel electrode is formed to connect to the switching element.

According to a method of forming a fine pattern, a display substrate and a method of manufacturing the same using the method of forming a fine pattern, a first metal pattern may be formed using a mask, and a first fine pattern may be formed using the first metal pattern as an etch stop pattern.

In addition, a second metal pattern may be formed between adjacent first fine patterns, and a second fine pattern may be formed between the adjacent first fine patterns using the second metal pattern as an etch stop pattern.

A polymer pattern is formed between the first and second fine patterns, so that light provided through first and second base substrates may be polarized in a first polarizing direction.

BRIEF DESCRIPTION OF THE DRAWINGS

The above and other features and advantages of the present invention will become more apparent by describing in detailed example embodiments thereof with reference to the accompanying drawings, in which.

DETAILED DESCRIPTION OF THE INVENTION

Hereinafter, the present invention will be explained in detail with reference to the accompanying drawings.

FIGS. 1A to 1K are cross-sectional views illustrating a method of forming a fine pattern according to an example embodiment of the present invention.

Figure 1A:
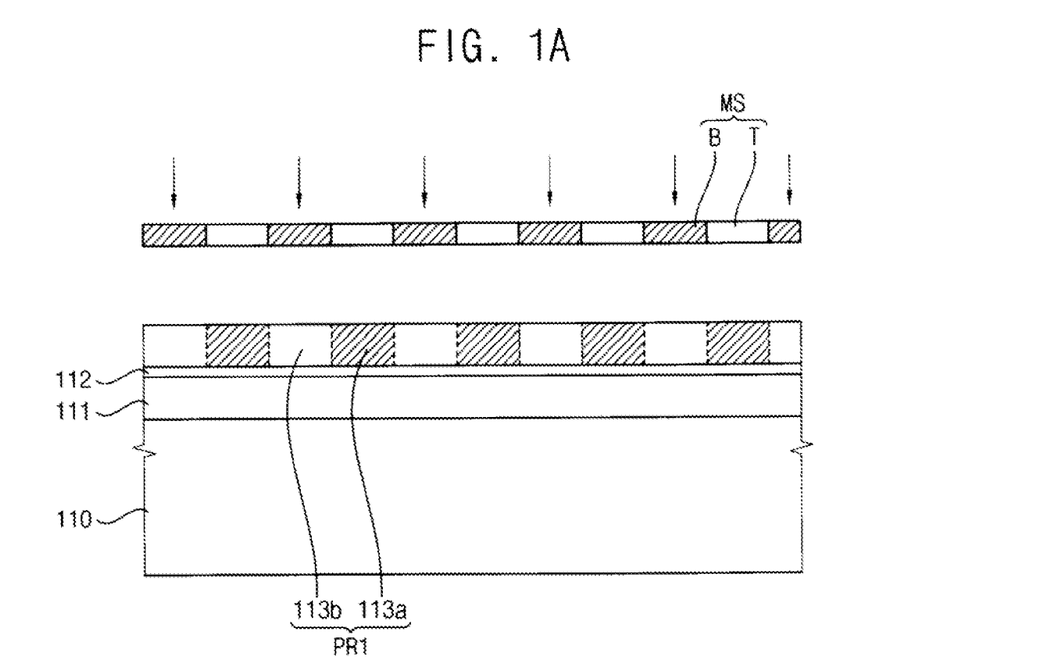
FIGS. 1A to 1K are cross-sectional views illustrating a method of forming a fine pattern according to an example embodiment of the present invention.

Referring to FIG. 1A, a first fine pattern layer 111, a first metal layer 112 and a first photoresist layer PR1 are sequentially deposited on a first base substrate 110. The first fine pattern layer 111 may be any suitable insulator, and may include a material capable of being deposited via a chemical vapor deposition (CVD) method and being etched by a dry etching method. Examples of a material that may be used for the first fine pattern layer 111 may include silicon nitride (SiNx), silicon oxide (SiOx) and aluminium (Al). The first metal layer 112 may include a transparent material not to be etched when the first fine pattern layer 111 is etched. Examples of a material that may be used for the first metal layer 112 may include indium-tin-oxide (ITO) and indium-zinc-oxide (IZO). A thickness of the first fine pattern layer 111 may be about 1 μm.

A mask MS having a transmissive portion T and a blocking portion B is disposed over the first base substrate 110 on which the first fine pattern layer 111, the first metal layer 112 and the first photoresist layer PR1 are deposited. The first photoresist layer PR1 may include a negative type or a positive type photoresist. Light is provided to the first base substrate 110 through the first mask MS.

For example, when the first photoresist layer PR1 is a positive type photoresist, a portion is exposed to the light through the transmissive portion T, so that a first removal portion 113a is formed in the first photoresist layer PR1. In addition, another portion is not exposed to the light, or is kept from exposure to light, through the blocking portion B, so that a first remaining portion 113b is formed in the first photoresist layer PR1. Here, the transmissive portion T has widths of about 2 μm and the blocking portion B has widths of about 2 μm, so that each of the first removal portion 113a and the first remaining portion 113b may have widths of about 2 μm.

Figure 1B:
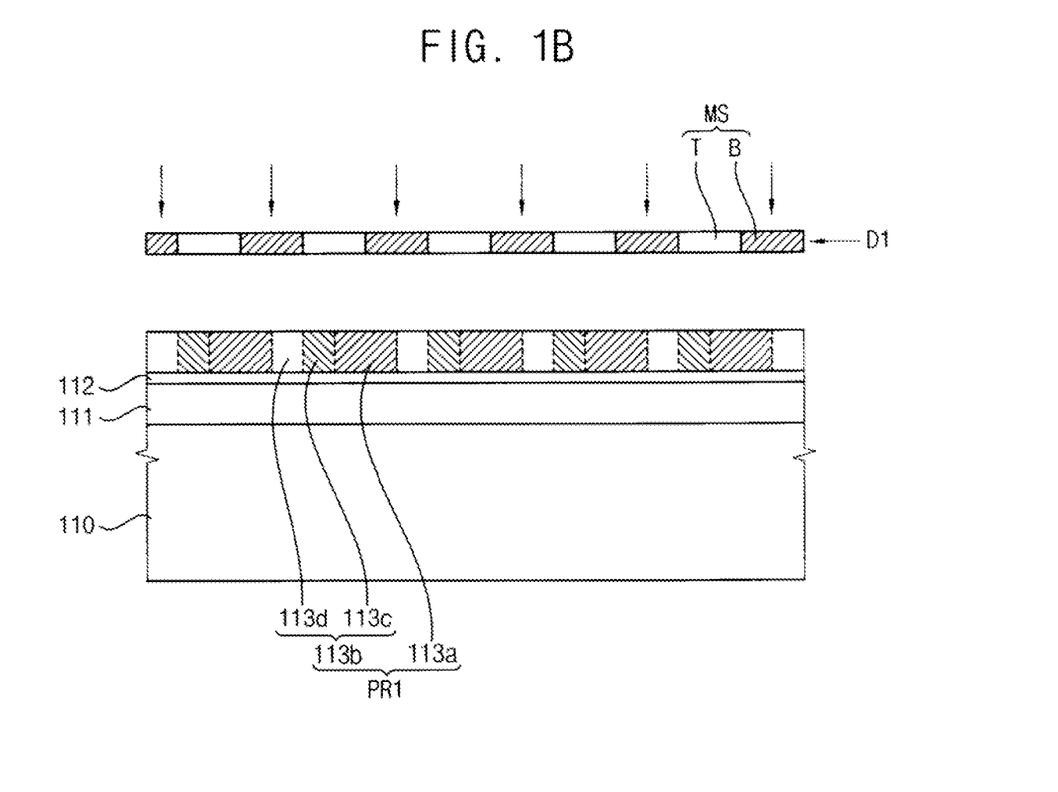

Referring to FIG. 1B, after the portions 113a and 113b are formed, the mask MS is shifted in a first direction D1 by about 1 μm relative to the first base substrate 110. Thus, each blocking portion B overlaps a first removal portion 113a by about 1 μm, and the transmissive portion T overlaps a first remaining portion 113b by about 1 μm.

Light is then provided to the first base substrate 110 through the shifted mask MS. Half of each first remaining portion 113b (i.e. the half overlapping a transmissive portion T) is then exposed to the light, so that a second removal portion 113c is formed in the first photoresist layer PR1. This second removal portion 113c overlaps about half of the first remaining portion 113b, creating a second remaining portion 113d that has widths of about 1 μm.

Figure 1C:
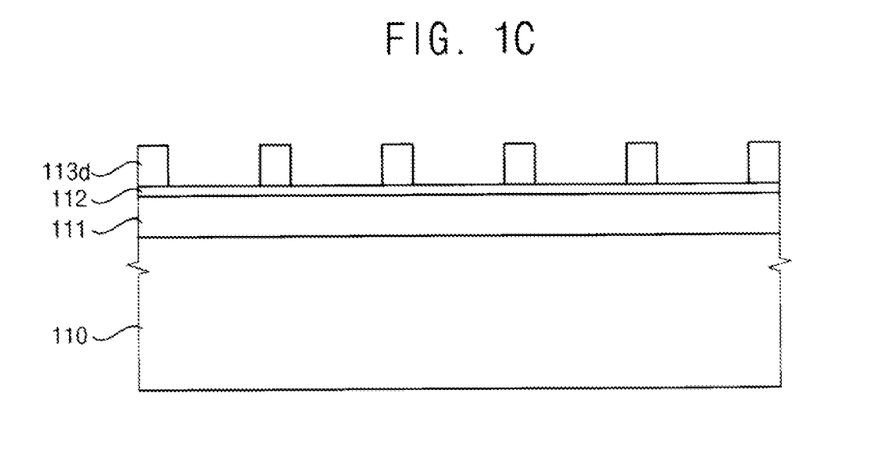
Figure 1D:
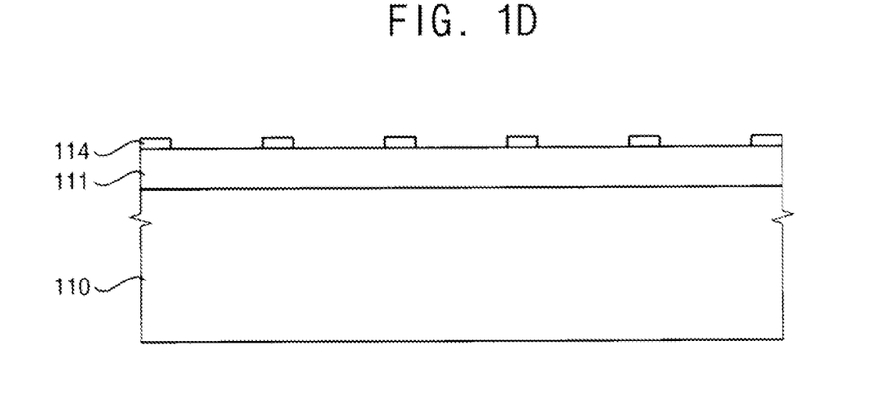

Referring to FIGS. 1C and 1D, the first photoresist layer PR1 is then removed, so that the second remaining portion 113d remains and the first metal layer 112 is partially exposed.

Thereafter, the first metal layer 112 is patterned using the second remaining portions 113d as a mask, so that a first metal pattern 114 is formed. Thus, the first fine pattern layer 111 is partially exposed. The second remaining portion 113d has widths of about 1 μm, so that the first metal pattern 114 may also have widths of about 1 μm.

Figure 1E:
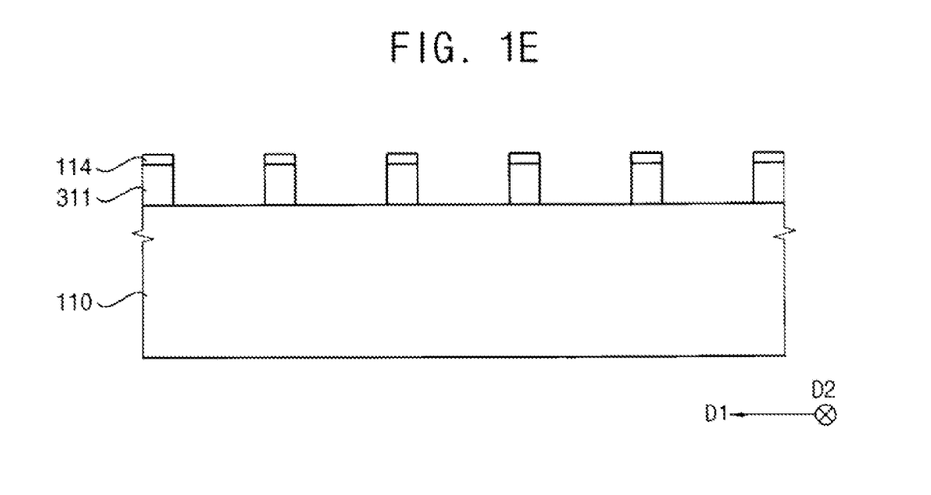

Referring to FIG. 1E, the first fine pattern layer 111 is patterned using the first metal pattern 114 as a mask, so that a first fine pattern 311 is formed. The first metal pattern 114 has widths of about 1 μm, so that the first fine pattern 311 may also have widths of about 1 μm. The first fine pattern 311 extends in the second direction D2 crossing the first direction D1 on the first base substrate 110.

Figure 1F:
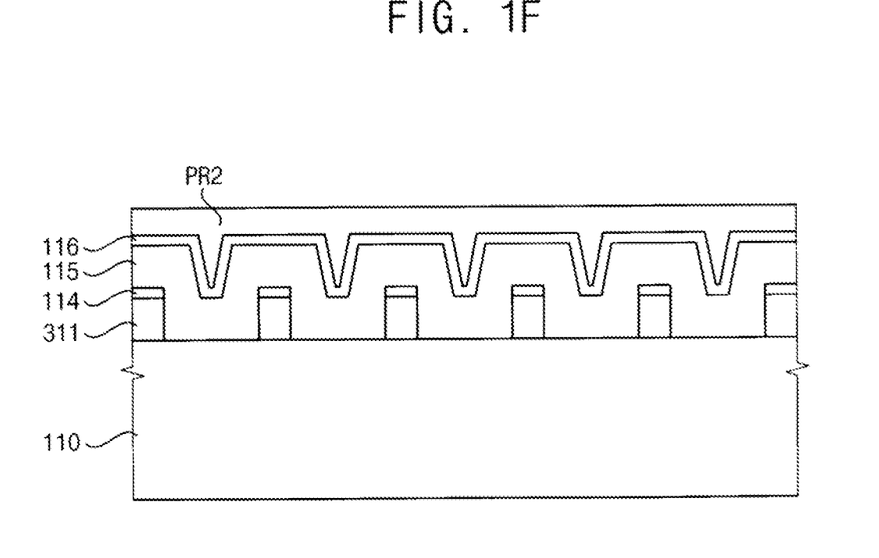

Referring to FIG. 1F, a second fine pattern layer 115, a second metal layer 116 and a second photoresist layer PR2 are sequentially deposited on the first base substrate 110 over the first fine pattern 311 and the first metal pattern 114. The second fine pattern layer 115 may include a material capable of being deposited via a CVD method and being etched by a dry etching method. Examples of a material that may be used for the second fine pattern layer 115 may include silicon nitride (SiNx), silicon oxide (SiOx) and aluminium Al. The second metal layer 116 may include a transparent material not to be etched when the second fine pattern layer 115 is etched. Examples of a material that may be used for the second metal layer 116 may include indium-tin-oxide (ITO) and indium-zinc-oxide (IZO).

The second fine pattern layer 115 may be formed with a thickness about equal to that of the first fine patterns 311, i.e. the thickness of the first fine pattern layer 111. For example, the second fine pattern layer 115 may be formed with a thickness of about 1 μm. Alternatively, the second fine pattern layer 115 may be formed with the thickness larger than that of the first fine patterns 311. For example, the second fine pattern layer 115 may be formed with the thickness more than about 1 μm.

Figure 1G:
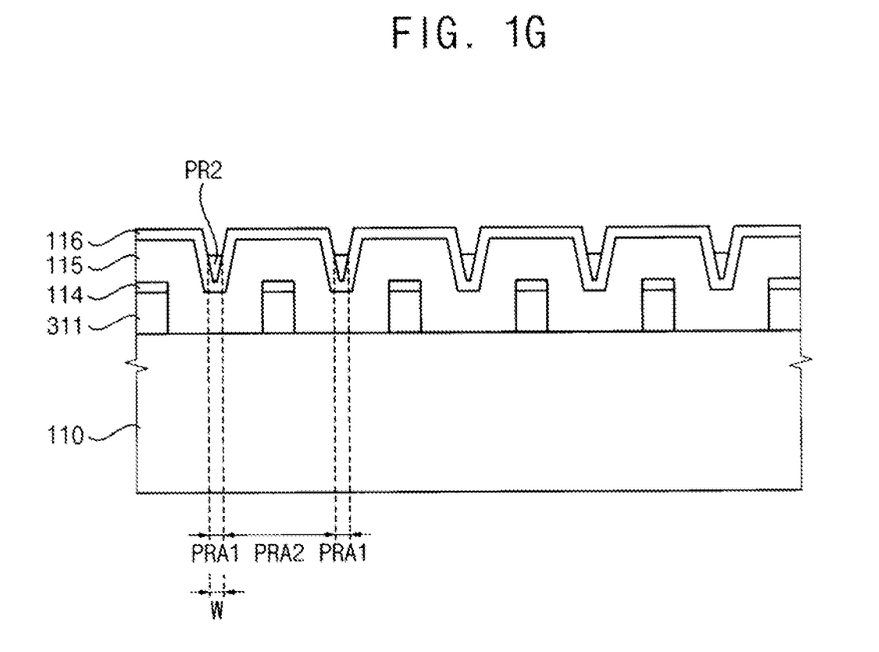

Referring to FIG. 1G, the second photoresist layer PR2 is ashed, and the second photoresist layer PR2 is removed, except for those portions lying in the depressions formed between adjacent fine patterns 311. More specifically, the second fine pattern layer 115 and the second metal layer 116 form recesses between the adjacent first fine patterns 311. Thus, when the second photoresist layer PR2 is ashed, the second photoresist layer PR2 in a second area PRA2 is removed, but the second photoresist layer PR2 in the first area PRA1 is not. The second metal layer 116 is thus mostly exposed. The second photoresist layer PR2 in the first area PRA1 may have widths W of slightly less than about 1 μm.

Alternatively, when the second fine pattern layer 115, the second metal layer 116 and the second photoresist layer PR2 are sequentially deposited on the first base substrate 110, the second photoresist layer PR2 may be deposited only in the first area PRA1. Thus, the process of ashing the second photoresist layer PR2 may be omitted.

Figure 1H:
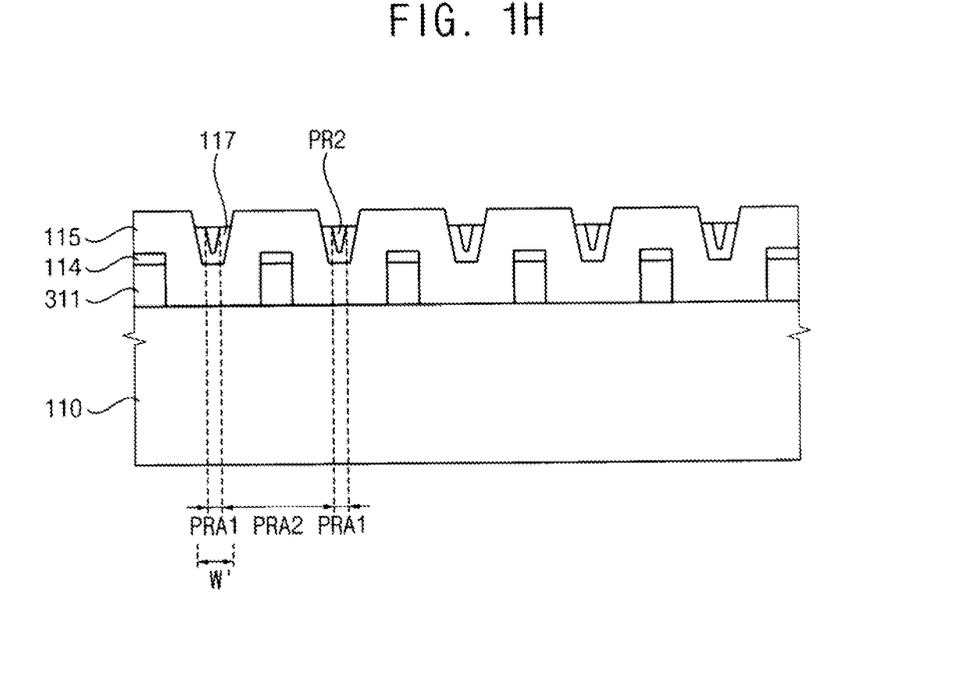

Referring to FIG. 1H, the second metal layer 115 is patterned using the second photoresist layer PR2 in the first area PRA1 as a mask, so that the second metal pattern 117 is formed. Thus, the second fine pattern layer 115 is partially, or mostly, exposed. The second photoresist layer PR2 in the first area PRA1 between the adjacent first fine patterns 311 has a width W of just less than about 1 μm, so that the second metal pattern 117 may have a width W' substantially similar to the width W of the second photoresist layer PR2 when viewed in a plan view.

Figure 1I:
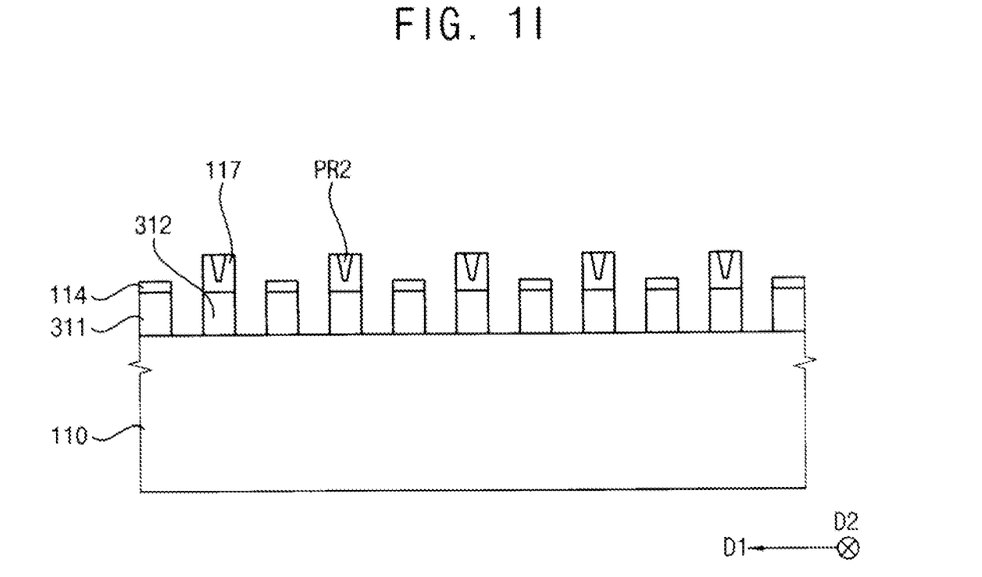

Referring to FIG. 1I, the second fine pattern layer 115 is patterned using the second metal pattern 117 as a mask or etch stop pattern, so that a second fine pattern 312 is formed between the adjacent first fine patterns 311. The first metal pattern 114 may prevent its underlying first fine pattern 311 from being patterned. The second metal pattern 117 has widths of about 1 μm when viewed in plan view, so that the second fine pattern 312 may also have widths of about 1 μm. The second fine pattern 312 extends between the adjacent first fine patterns 311 on the first base substrate 110 in the second direction D2. The individual patterns of the second fine pattern 312 may be spaced apart from each of the adjacent first fine patterns 311 by about 1 μm.

Figure 1J:
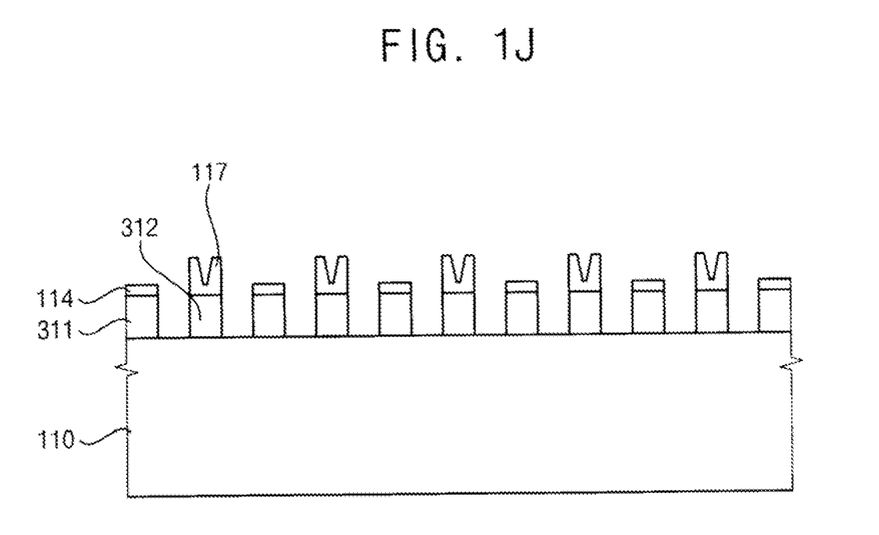

Referring to FIG. 1J, the second photoresist layer PR2 between the adjacent first fine patterns 311 is stripped, and then removed.

Alternatively, in FIG. 1I, when the second fine pattern layer 115 is patterned using the second metal pattern 117 as a mask or etch stop pattern, the second photoresist layer PR2 between the adjacent first fine patterns 311 may be simultaneously etched, and then removed.

Figure 1K:
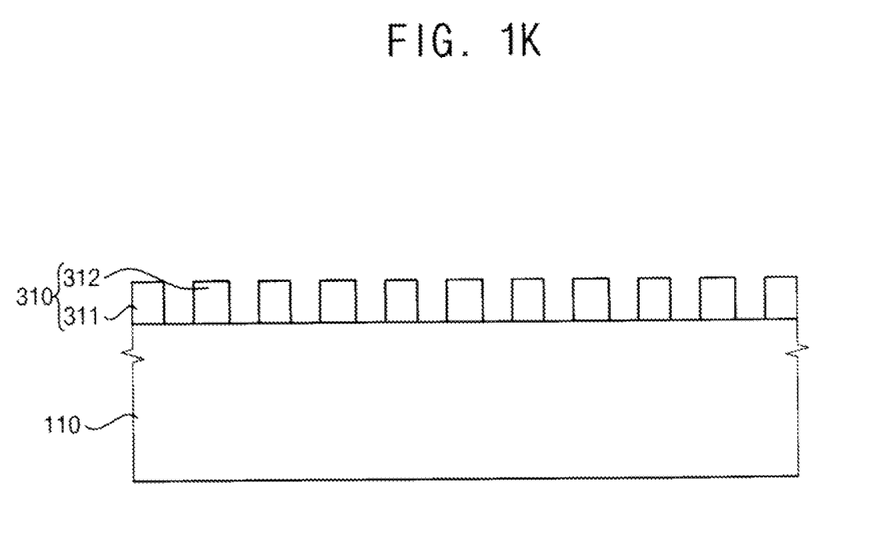

Referring to FIG. 1K, first and second metal patterns 114 and 117 are removed by etching, so that top surfaces of the first and second patterns 311 and 312 are exposed. Thus, the first and second fine patterns 311 and 312 are formed.

Figure 2:
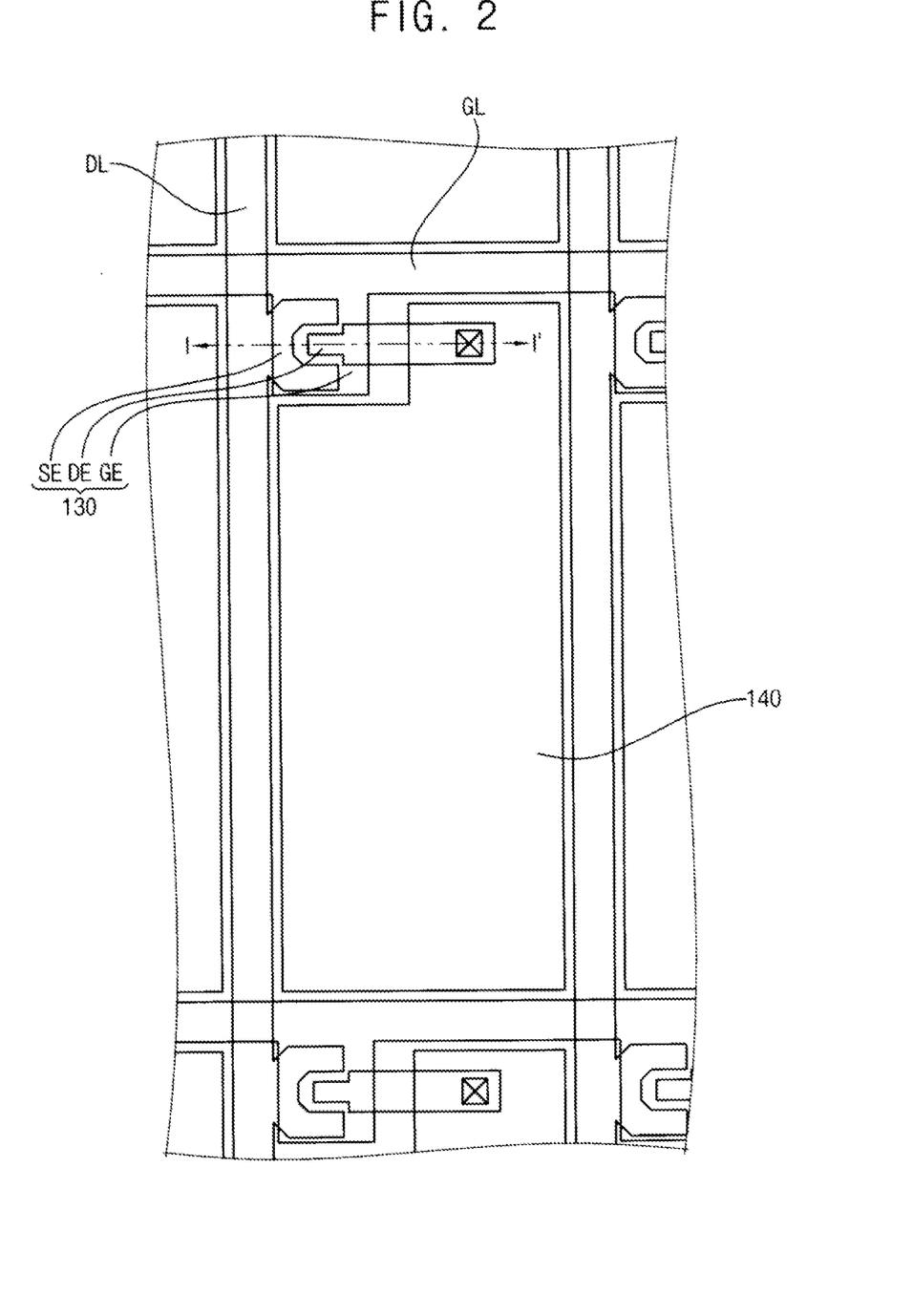
FIG. 2 is a plan view illustrating a first display substrate according to another example embodiment of the present invention.
Figure 3:
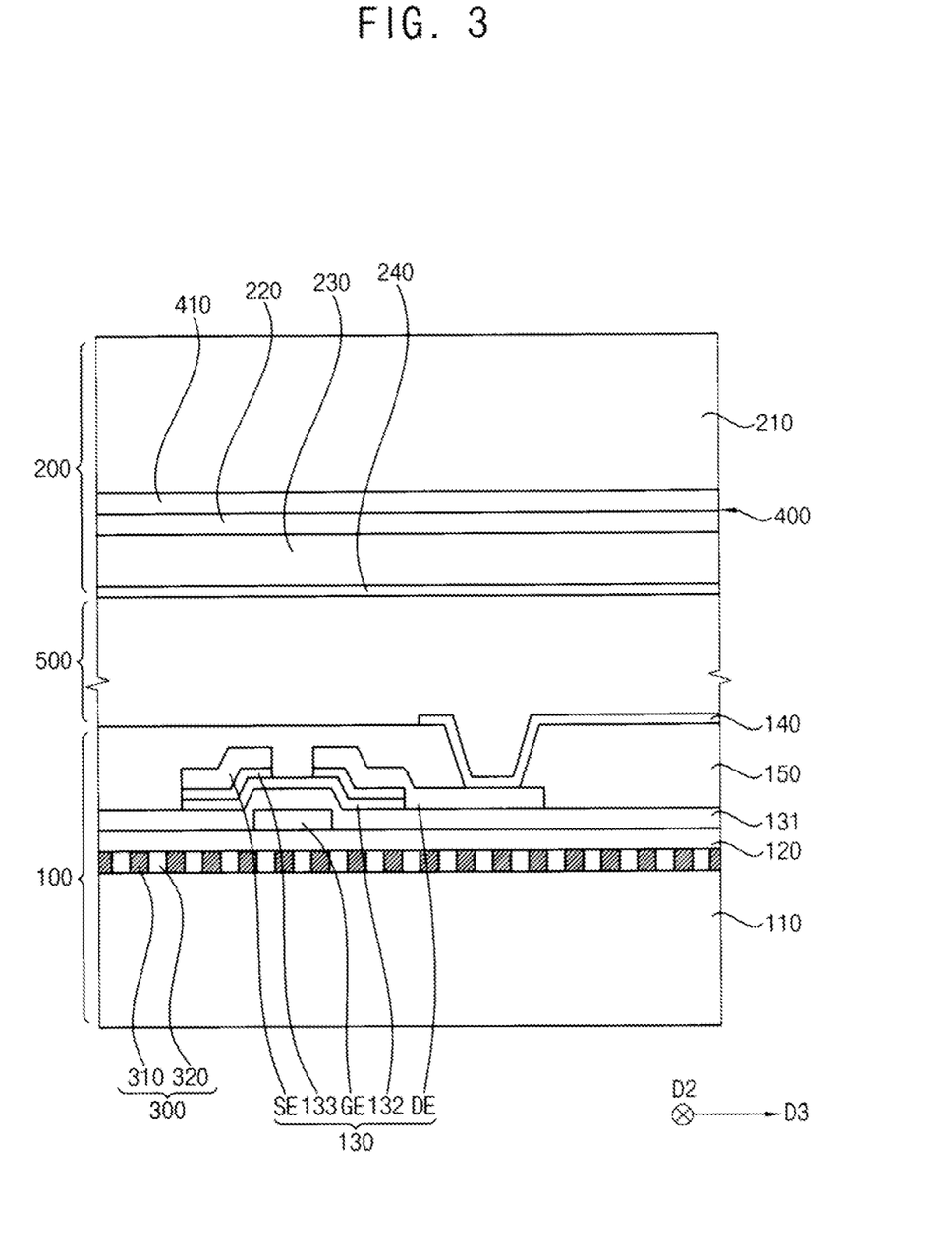
FIG. 3 is a cross-sectional view illustrating a display panel including a first display substrate taken along a line I-I' of FIG. 2.

FIG. 2 is a plan view illustrating a first display substrate according to another example embodiment of the present invention. FIG. 3 is a cross-sectional view taken along a line IT of FIG. 2 and illustrating both the display substrate of FIG. 2 as well as a display panel incorporating this display substrate.

Referring to FIGS. 2 and 3, a display device 1000 according to a present example embodiment includes a first display substrate 100, a second display substrate 200 and a liquid crystal layer 500.

The display substrate 100 includes a first base substrate 110, a first polarizing layer 300, a first protecting layer 120 and a plurality of pixel parts.

The first polarizing layer 300 includes a first guide pattern 310 and a first polymer pattern 320. The first guide pattern 310 extends in the second direction D2 on the first base substrate 110. Adjacent first guide patterns 310 are generally parallel to each other. The first guide pattern 310 has a width of about 1 µm. The adjacent first guide patterns 310 are spaced apart from each other to define spaces having widths of about 1 µm. The first guide patterns 310 may include a material capable of being deposited by a chemical vapor deposition (CVD) method and being etched by a dry etching method. Examples of a material that may be used for the first guide pattern 310 may include silicon nitride (SiNx), silicon oxide (SiOx) and aluminum (Al).

The first polymer pattern 320 is formed in the spaces defined by adjacent first guide patterns 310. The first polymer pattern 320 extends in a second direction D2. The first polymer pattern 320 polarizes light that passes through the first base substrate 110 or a second base substrate 210 described hereinafter, in a first polarizing direction.

The first protecting layer 120 is formed on the first polarizing layer 300 to protect the first polarizing layer 300. The first protecting layer 120 may be an organic layer.

The pixel part includes a switching element 130 and a pixel electrode 140. The switching element 130 is formed on the first protecting layer 120. The switching element 130 includes a gate electrode GE connected to a gate line GL, a source electrode SE connected to a data line DL crossing the gate line GL, and a drain electrode DE spaced apart from the source line SE. The pixel electrode 140 is electrically connected to the drain electrode DE.

The second display substrate 200 faces the first display substrate 100. The second display substrate 200 includes second base substrate 210, a second polarizing layer 400, a second protecting layer 220, a color filter layer 230 and a common electrode layer 240.

The second polarizing layer 400 includes a number of second guide patterns 410 and a second polymer pattern (not shown). Each second guide pattern 410 extends in a third direction D3 crossing the second direction D2 on the second base substrate 110. Adjacent second guide patterns 410 are generally parallel to each other. Each second guide pattern 410 has a width of about 1 µm. The adjacent second guide patterns 410 are spaced apart from each other to define spaces having widths of about 1 µm. The first guide pattern 410 may include a material capable of being deposited by a CVD method and being etched by a dry etching method. Examples of a material that may be used for the second guide pattern 410 may include silicon nitride (SiNx), silicon oxide (SiOx) and aluminum (Al).

The second polymer pattern is formed in the space defined by the second guide patterns 410 (i.e. between adjacent second guide patterns 410). The second polymer pattern extends in the third direction D3. The second polymer pattern polarizes the light provided through the first base substrate 110 or the second base substrate 210 in a second polarizing direction different from (in this case, generally perpendicular to) the first polarizing direction.

The second protecting layer 220 is formed on the second polarizing layer 400 to protect the second polarizing layer 400. The protecting layer 220 may be an organic layer.

The color filter layer 230 is formed on the second protecting layer 220. The color filter layer 230 may include color filters such as red, green and blue color filters respectively corresponding to the pixel parts.

The common electrode layer 240 is formed on the color filter layer 230. The common electrode layer 240 receives a voltage potential along with the pixel electrode layer 140, to change an arrangement of liquid crystals of the liquid crystal layer 500. Thus, the liquid crystal layer 500 is selectively arranged so as to transmit or block light, thus generating an image.

FIGS. 4A to 4G are cross sectional views illustrating a process of manufacturing the first display substrate of FIG. 2.

Figure 4A:
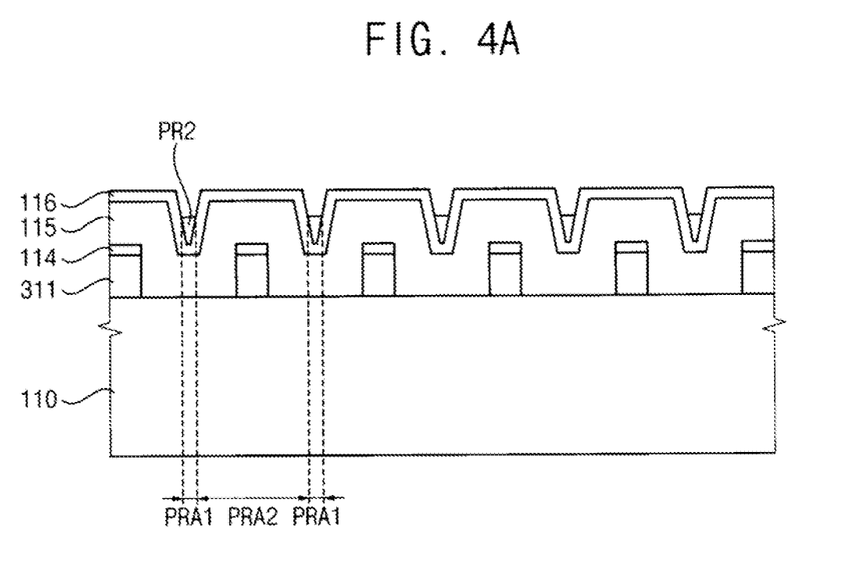
FIGS. 4A to 4G are cross sectional views illustrating a process of manufacturing the first display substrate of FIG. 2.

Referring to FIG. 4A, a second fine pattern layer 115 and a second metal layer 116 are sequentially deposited on the first base substrate 110 on which the first fine pattern 311 and the first metal pattern 114 on the first fine pattern 311 are already formed. The second fine pattern layer 115 and the second metal layer 116 have recesses formed between adjacent first fine patterns 311. A second photoresist layer PR2 is formed on the second metal layer 116 within the recesses, as above.

Figure 4B:
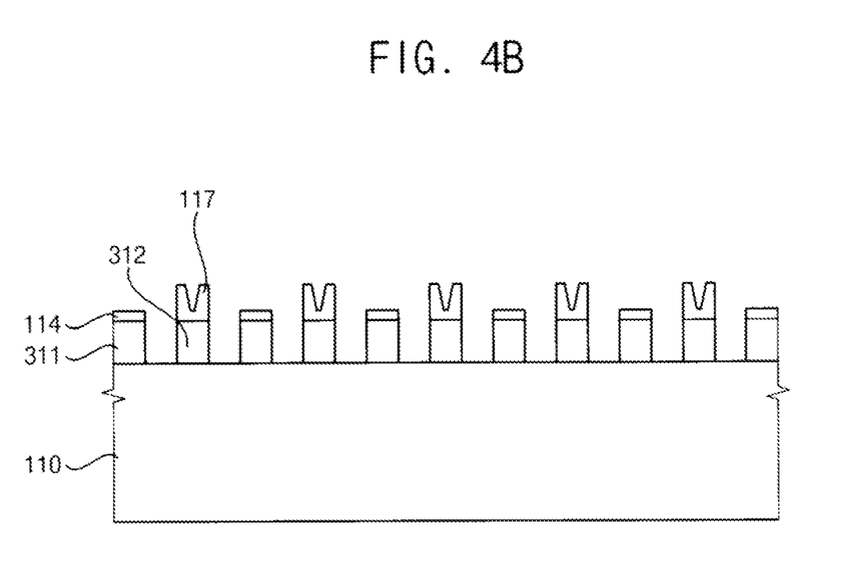

Referring to FIG. 4B, and as explained previously, the second metal layer 116 is patterned using the second photoresist layer PR2, so that the second metal pattern 117 is formed, and the second fine pattern layer 115 is patterned using the second metal pattern 117 as a mask or etch stop layer, so that the second fine pattern 312 is formed.

Figure 4C:
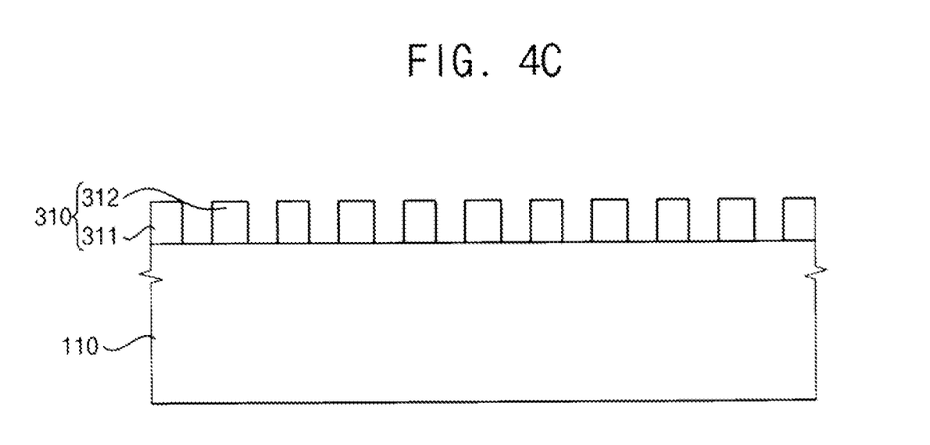

Referring to FIG. 4C, the second photoresist layer PR2 and the second metal pattern 117 are stripped, so that first guide patterns 310, including the first and second fine patterns 311 and 312, are formed on the first base substrate 110.

Figure 4D:
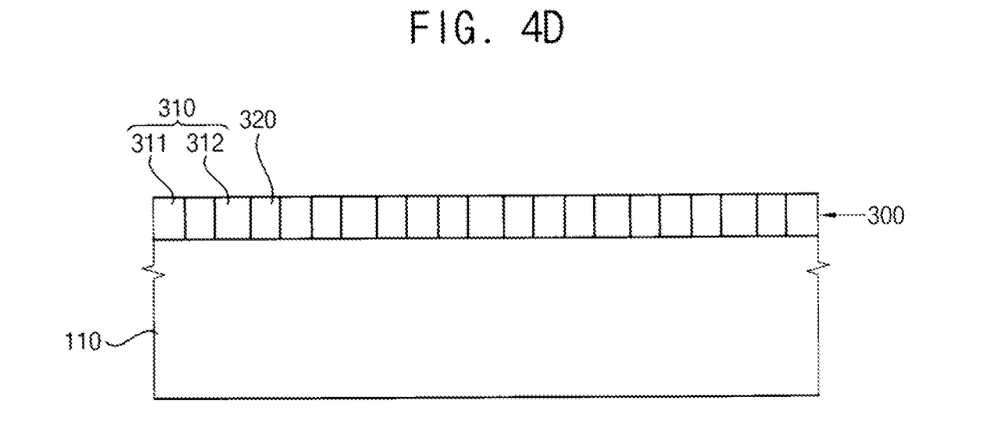

Referring to FIG. 4D, a polymer is filled in the spaces between the first fine pattern 311 and the second fine pattern 312. This polymer is reacted under conditions that yield a first polymer pattern 320 that can polarize light provided through the first base substrate 110 or from external sources, in the first polarizing direction. For example, reaction of the polymer can occur by heating the first base substrate 110.

Figure 4E:
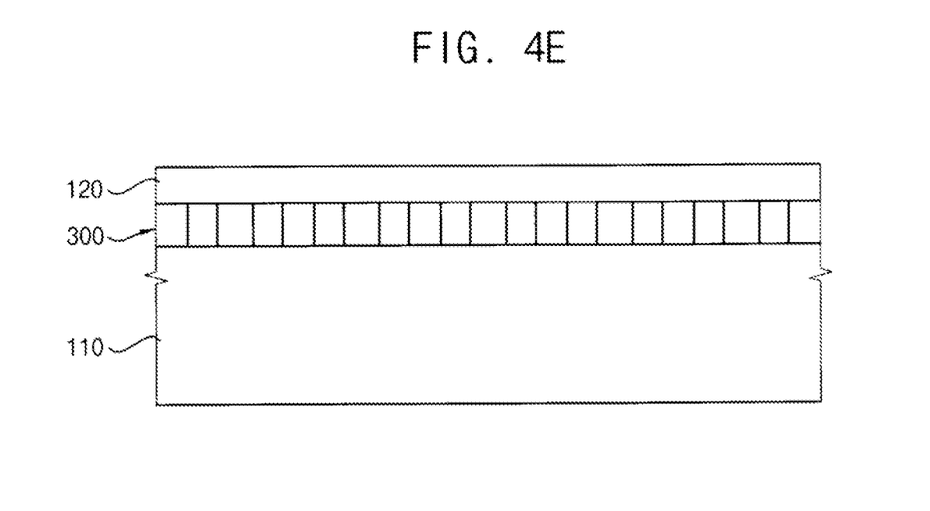

Referring to FIG. 4E, the first protecting layer 120 is deposited on the first polarizing layer 300 to protect the first polarizing layer 300. The first protecting layer 120 can include an organic layer.

Figure 4F:
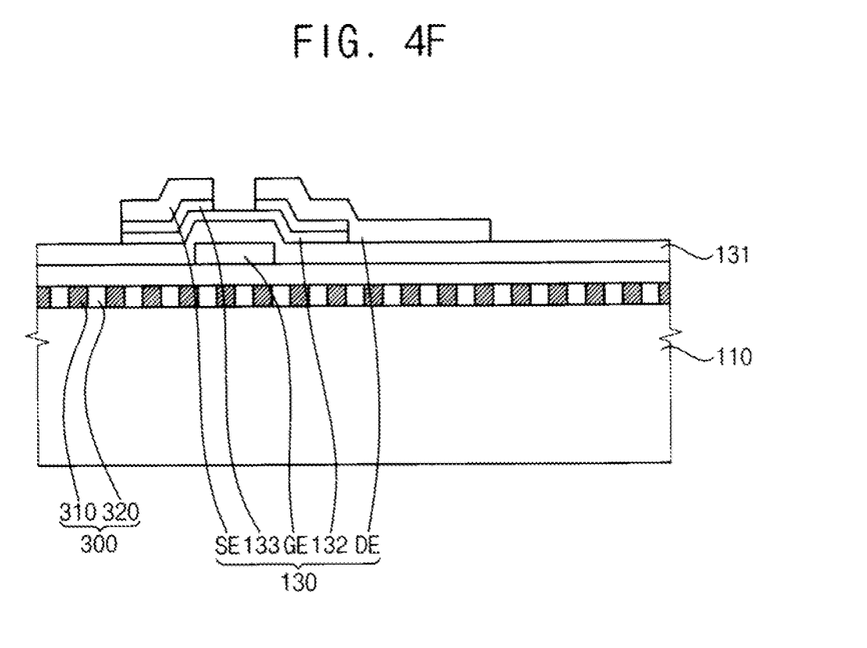

Referring to FIG. 4F, a gate metal layer is deposited on the first base substrate 110 over the first polarizing layer 300 and the first protecting layer 120. The gate metal layer is patterned, so that the gate electrode GE is formed. A gate insulating layer 131, a semiconductor layer 132 and an ohmic contact layer 133 are then formed on the first base substrate 110 over the gate electrode GE. The semiconductor layer 132 and the ohmic contact layer 133 are patterned, and then a data metal layer is formed over the semiconductor layer 132 and the ohmic contact layer 133. The data metal layer is patterned, so that the source electrode SE and the drain electrode DE are formed. Thus, the switching element 130 including the gate electrode GE, the source electrode SE and the drain electrode DE is formed.

Figure 4G:
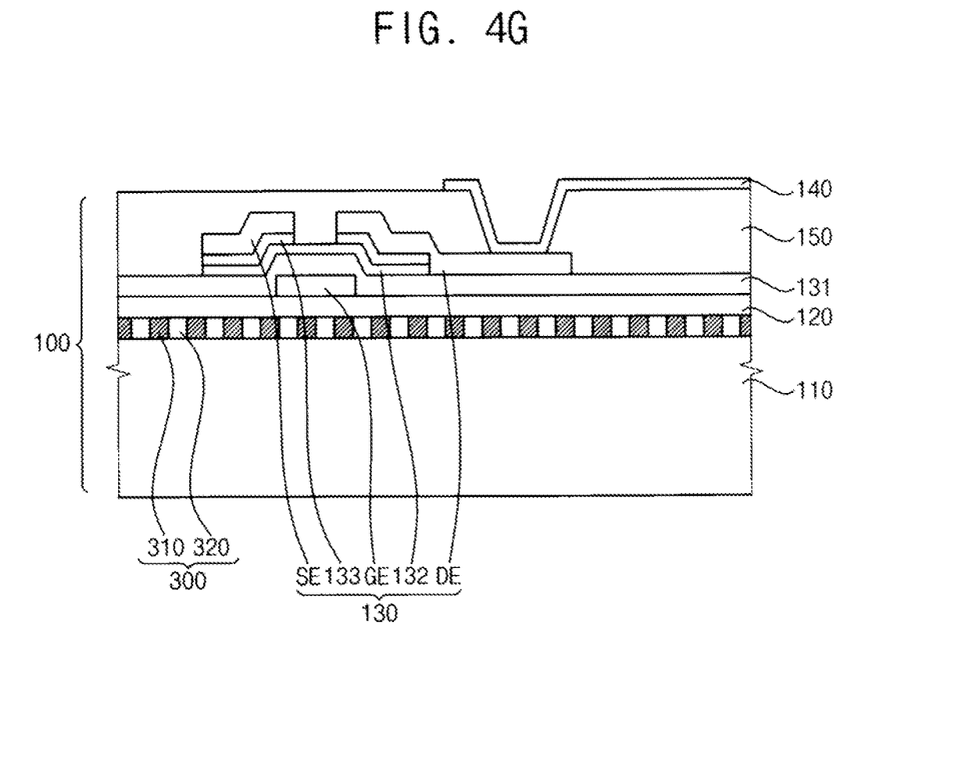

Referring to FIG. 4G, a passivation layer 150 protecting the switching element 130 is formed on the first base substrate 110 over the switching element 130. A contact hole is formed in the passivation layer 150, and a pixel electrode 140 is formed in (as well as outside of) the contact hole to be electrically connected to drain electrode DE. In this manner, a first display substrate 110 is formed to include the first polarizing layer 300, the second protecting layer 120, the pixel layer having the switching element 130, and the pixel electrode layer having the pixel electrode 140.

Figure 5:
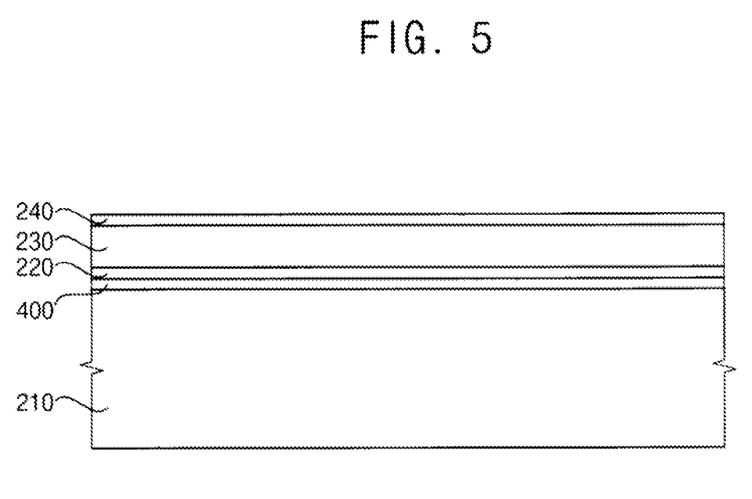
FIG. 5 is a cross sectional view illustrating a process of manufacturing a second display substrate of FIG. 2.

FIG. 5 is a cross sectional view illustrating a process of manufacturing a second display substrate of FIG. 2. Like reference numerals are used to refer to previously-described structures.

Referring to FIG. 5, the second polarizing layer 400 and the second protecting layer 220 are formed on the second base substrate 210.

The process of manufacturing the second polarizing layer 400 and the second protecting layer 220 can be substantially the same as the process of manufacturing the first polarizing layer 300 and the first protecting layer 120, except for a direction in which first and second fine patterns and a second polymer pattern extend. Accordingly, each of the layers 220, 400 may include the same structures and elements as layers 120 and 300, and any repetitive explanation concerning the above elements will be omitted.

A color filter layer 230 and a common electrode layer 240 are sequentially formed on the second base substrate 210 over the second protecting layer 220. Thus, a second display substrate 200 is formed to include the second polarizing layer 400, the second protecting layer 220, the color filter layer 230 and the common electrode layer 240.

According to the present example embodiment, a mask is shifted over the first fine pattern layer 111 as described above, then the fine first metal pattern 114 having widths of about 1 µm is formed. The first fine pattern layer 111 is then patterned using the first metal pattern 114, so that the first fine pattern 311 is formed to a width of about 1 µm.

In addition, the second fine pattern layer 115 is formed over the first fine pattern 311 and the first metal pattern 114. The second metal pattern 117 is then formed between the adjacent first fine patterns 311, and the second fine pattern layer 115 is patterned using the second metal pattern 117, so that the second fine pattern 312 may be formed between the adjacent first fine patterns 311.

According to embodiments of the invention, a first metal pattern may be formed using a mask, and a first fine pattern may be formed using the first metal pattern as an etch stop pattern.

In addition, a second metal pattern may formed between adjacent first fine patterns, and a second fine pattern may be formed between the adjacent first fine patterns using the second metal pattern as an etch stop pattern.

A polymer pattern is formed between the first and second fine patterns, so that light provided through first and second base substrates may be polarized in a specified direction, i.e. the direction along which the first and second fine patterns extend.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures.

Therefore, it is to be understood that the foregoing is illustrative of the present invention and is not to be construed as limited to the specific example embodiments disclosed, and that modifications to the disclosed example embodiments, as well as other example embodiments, are intended to be included within the scope of the appended claims. The present invention is defined by the following claims, with equivalents of the claims to be included therein.

What is claimed is:

1. A method of forming a fine pattern, the method comprising:
    forming a first fine pattern and a first metal pattern by respectively patterning a first fine pattern layer formed on a base substrate and a first metal layer on the first fine pattern layer;
    sequentially forming a second fine pattern layer and a second metal layer on the base substrate and over the first fine pattern and the first metal pattern;
    patterning the second metal layer to form a second metal pattern between adjacent portions of the first fine patterns; and
    patterning the second fine pattern layer using the second metal pattern as an etch stop pattern, so as to form a second fine pattern between the adjacent portions of the first fine patterns.

2. The method of claim 1, wherein the forming a first fine pattern and a first metal pattern further comprises:
    sequentially forming the first fine pattern layer and the first metal layer on the base substrate;
    forming a first photoresist pattern on the first metal layer;
    patterning the first metal layer using the first photoresist pattern, so as to form a first metal pattern; and
    forming the first fine pattern using the first metal pattern as an etch stop pattern.

3. The method of claim 2, wherein the forming a first photoresist pattern further comprises:
    forming a first photoresist layer on the first metal layer;
    positioning a mask over the first photoresist layer, the mask having a transmissive portion and a blocking portion, at least one of the transmissive portion and the blocking portion having a first width;
    exposing the first photoresist layer to light through the transmissive portion;
    shifting the mask by a second width smaller than the first width;
    exposing the first photoresist layer to light through the shifted transmissive portion; and
    developing the first photoresist layer to form the first photoresist pattern.

4. The method of claim 1, wherein the sequentially forming a second fine pattern layer and a second metal layer comprises:
    forming the second fine pattern layer with recesses between adjacent ones of the first fine patterns; and
    forming the second metal layer on the second fine pattern layer.

5. The method of claim 4, wherein the patterning the second metal layer further comprises:
    depositing a second photoresist pattern in the recesses; and
    patterning the second metal layer using the second photoresist pattern, so as to form the second metal pattern.

6. The method of claim 4, wherein the patterning the second metal layer further comprises:
    forming a second photoresist layer on the second metal layer;
    patterning the second photoresist layer to form a second photoresist pattern in the recesses; and patterning the second metal layer using the second photoresist pattern, so as to form the second metal pattern.

7. The method of claim 1, wherein the sequentially forming a second fine pattern layer and a second metal layer further comprises:
   forming the second fine pattern layer having a same thickness as a thickness of the first fine pattern layer.

8. The method of claim 1, wherein the sequentially forming a second fine pattern layer and a second metal layer further comprises:
   forming the second fine pattern layer having a thickness greater than that of the first fine pattern layer.

9. The method of claim 1, further comprising removing the first and second metal patterns.

10. A display substrate, comprising:
   a base substrate;
   a polarizing layer on the base substrate and configured to polarize light, the polarizing layer having a first fine pattern extending in a first direction, a second fine pattern having portions disposed between adjacent portions of the first fine patterns and extending in the first direction, and a polymer pattern filling a space between the first and second fine patterns;
   a switching element connected to a data line and a gate line that are formed on the polarizing layer; and
   a pixel electrode connected to the switching element.

11. The display substrate of claim 10, wherein the first and second fine patterns each have widths of about 1 μm, and a space between adjacent ones of the portions of the first and second fine patterns has a width of about 1 μm.

12. The display substrate of claim 10, further comprising a protecting layer formed on the polarizing layer and protecting the polarizing layer,
   wherein the protecting layer is an organic layer.

13. A method of manufacturing a display substrate, the method comprising:
   forming a polarizing layer on a base substrate, the polarizing layer including a first fine pattern extending in a first direction, a second fine pattern having portions disposed between adjacent portions of the first fine pattern and extending in the first direction, and a polymer pattern filling a space between the first and second fine patterns;
   patterning a gate metal layer and a data metal layer that are formed over the polarizing layer, so as to form a gate line, a data line and a switching element connected to the gate line and the data line; and
   patterning a pixel electrode layer formed over the switching element, so as to form a pixel electrode connected to the switching element.

14. The method of claim 13, wherein the forming a polarizing layer further comprises:
   patterning a first fine pattern layer formed on the base substrate and a first metal layer positioned on the first fine pattern layer, so as to form the first fine pattern and a first metal pattern;
   sequentially forming a second fine pattern layer and a second metal layer on the base substrate over the first metal pattern;
   patterning the second metal layer to form a second metal pattern positioned between adjacent portions of the first fine pattern;
   patterning the second fine pattern layer using the second metal pattern as an etch stop pattern, so as to form the second fine pattern; and
   forming the polymer pattern in a space between the portions of the first and second fine patterns.

15. The method of claim 14, wherein the sequentially forming a second fine pattern layer and a second metal layer further comprises:
   forming the second fine pattern layer with recesses positioned between adjacent portions of the first fine patterns; and
   forming the second metal layer on the second fine pattern layer.

16. The method of claim 15, wherein the patterning the second metal layer further comprises:
   forming a second photoresist pattern in the recesses; and
   patterning the second metal layer using the second photoresist pattern, so as to form the second metal pattern.

17. The method of claim 15, wherein the patterning the second metal layer further comprises:
   forming a second photoresist layer on the second metal layer;
   patterning the second photoresist layer to form a second photoresist pattern in the recesses; and
   patterning the second metal layer using the second photoresist pattern, so as to form the second metal pattern.

18. The method of claim 14, wherein the sequentially forming a second fine pattern layer and a second metal layer further comprises:
   forming the second fine pattern layer having a thickness equal to or greater than that of the first fine pattern layer.

19. The method of claim 14, wherein the forming the polymer pattern further comprises:
   depositing a polymer in a space between the portions of the first and second fine patterns; and
   applying heat to the base substrate.

20. The method of claim 13, further comprising:
   forming a protecting layer on the polarizing layer.

* * * * *